United States Patent [19]
Babow et al.

[11] Patent Number: 4,717,347
[45] Date of Patent: Jan. 5, 1988

[54] FLATPACK BURN-IN SOCKET

[75] Inventors: David A. Babow, Phoenix; Thomas K. Doench, Scottsdale; Angelo V. Angeleri, Mesa, all of Ariz.

[73] Assignee: AMP Incorporated, Harrisburg, Pa.

[21] Appl. No.: 6,315

[22] Filed: Jan. 14, 1987

Related U.S. Application Data
[63] Continuation of Ser. No. 781,570, Sep. 30, 1985, abandoned.

[51] Int. Cl.$^4$ .................. H01R 23/72; H01R 13/627
[52] U.S. Cl. ...................................... 439/72; 439/330; 439/525
[58] Field of Search .......... 339/17 CF, 75 M, 75 MP, 339/91 R, 176 M, 176 MP; 439/68–73, 525, 330, 331

[56] References Cited

U.S. PATENT DOCUMENTS

| | | | |
|---|---|---|---|
| 3,393,396 | 7/1968 | Majewski | 339/92 M |
| 3,892,312 | 7/1975 | Tems | 339/17 CF |
| 4,176,895 | 12/1979 | Aldridge | 339/17 CF |
| 4,236,777 | 12/1980 | Merline et al. | 339/17 CF |
| 4,427,249 | 1/1984 | Bright et al. | 339/17 CF |
| 4,542,949 | 9/1985 | Tewes et al. | 339/17 CF |

FOREIGN PATENT DOCUMENTS
463245 7/1975 U.S.S.R. .................. 339/17 CF

OTHER PUBLICATIONS
"Soft Touch" Flat-Pack Sockets, (3M Brochure No. TD-2608, 3–81).
Welcon Burn-In Test Contactors, (Wells Electronics Inc. Brochure).

Primary Examiner—Neil Abrams
Attorney, Agent, or Firm—Eric J. Groen; Robert W. Pitts

[57] ABSTRACT

A burn-in test socket for use with flatpack semiconductor components is disclosed. The flatpack burn-in socket is especially adapted for use with robotic assembly techniques. The socket comprises an insulative housing with a plurality of terminals adapted to be in registry with leads on a flatpack semiconductor device located in a conventional flatpack carrier. The terminals are doubly reversely formed to laterally wipe the leads during insertion. Electrical continuity of the socket terminals and dynamic electrical testing of the semiconductor device can be probed from above the socket.

20 Claims, 9 Drawing Figures

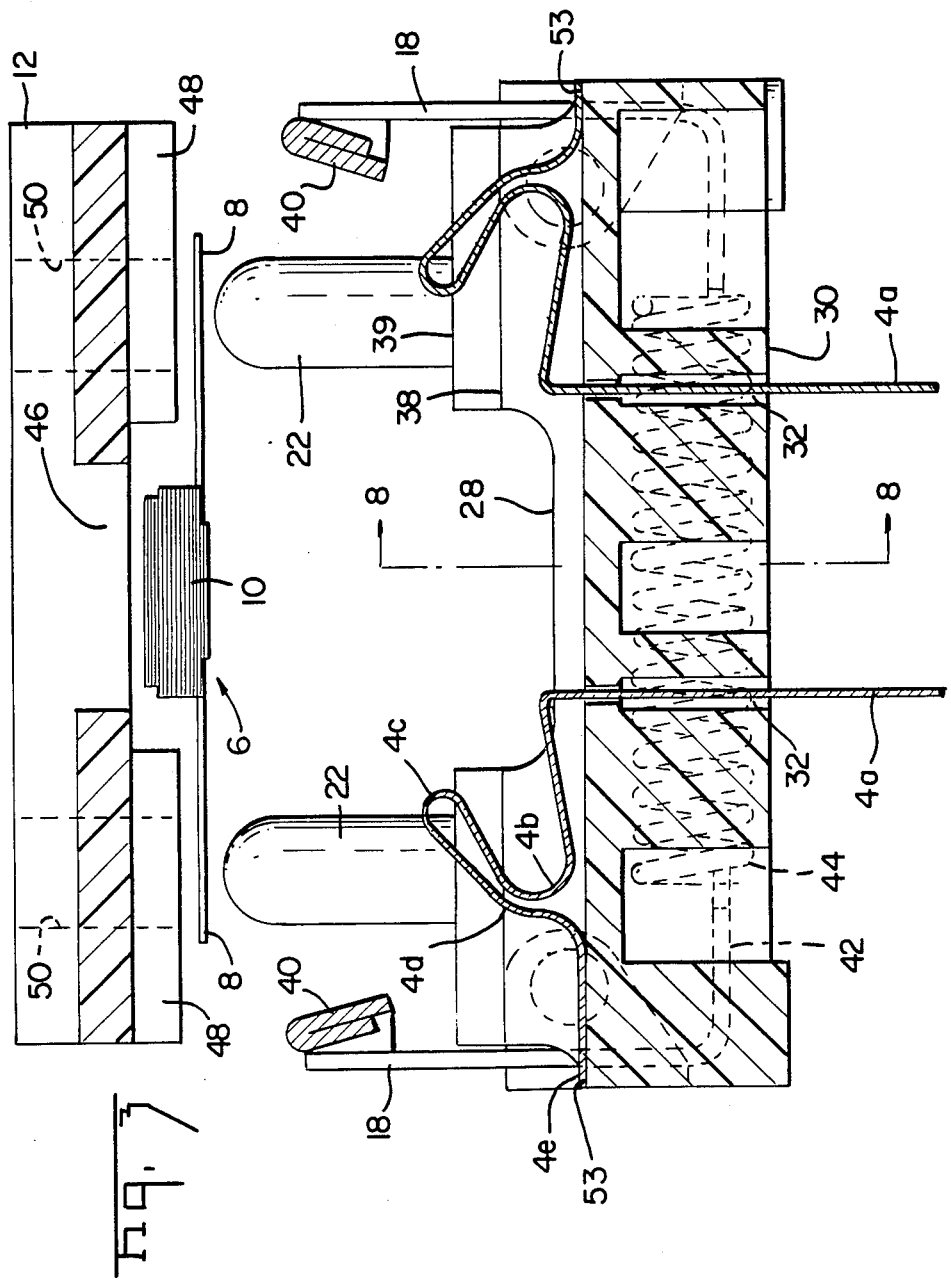

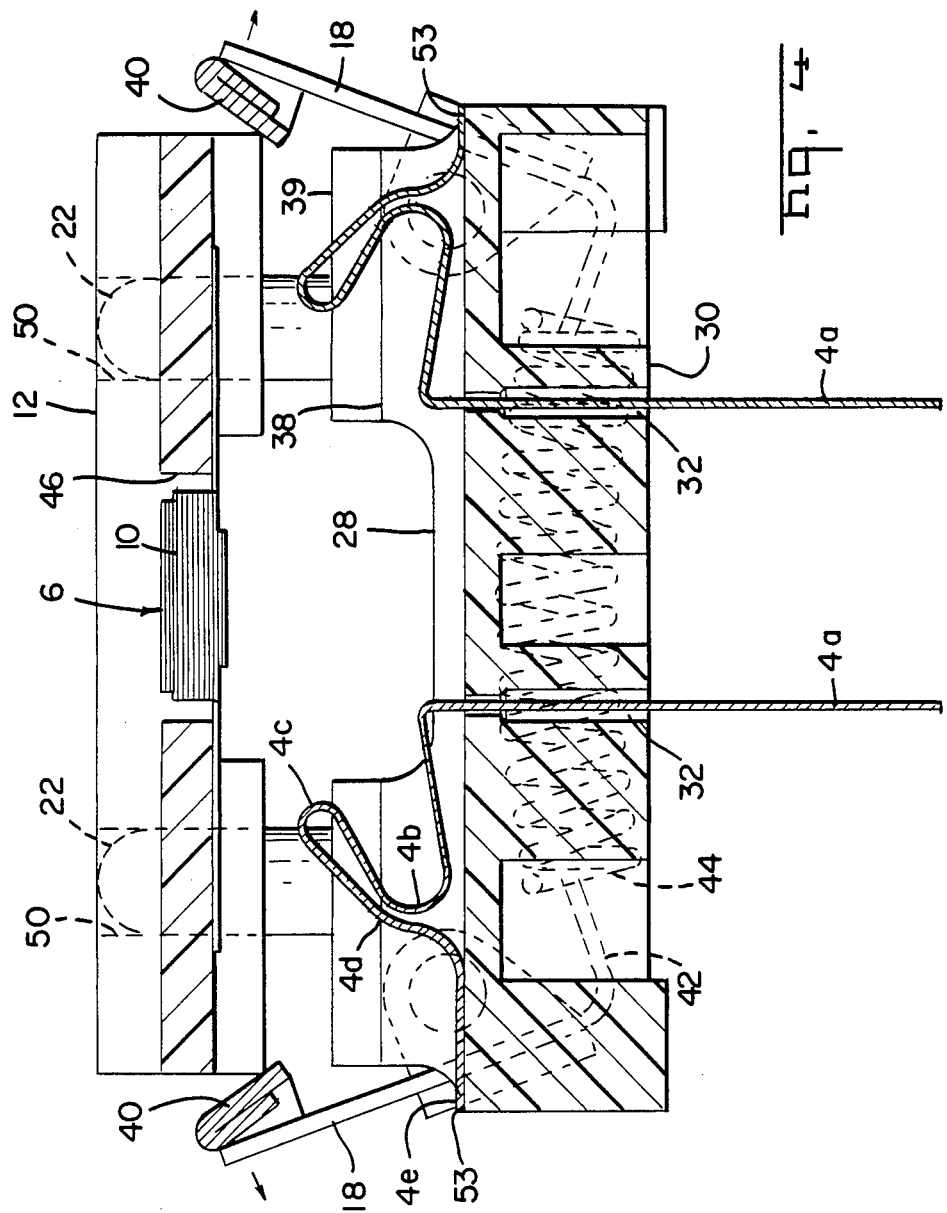

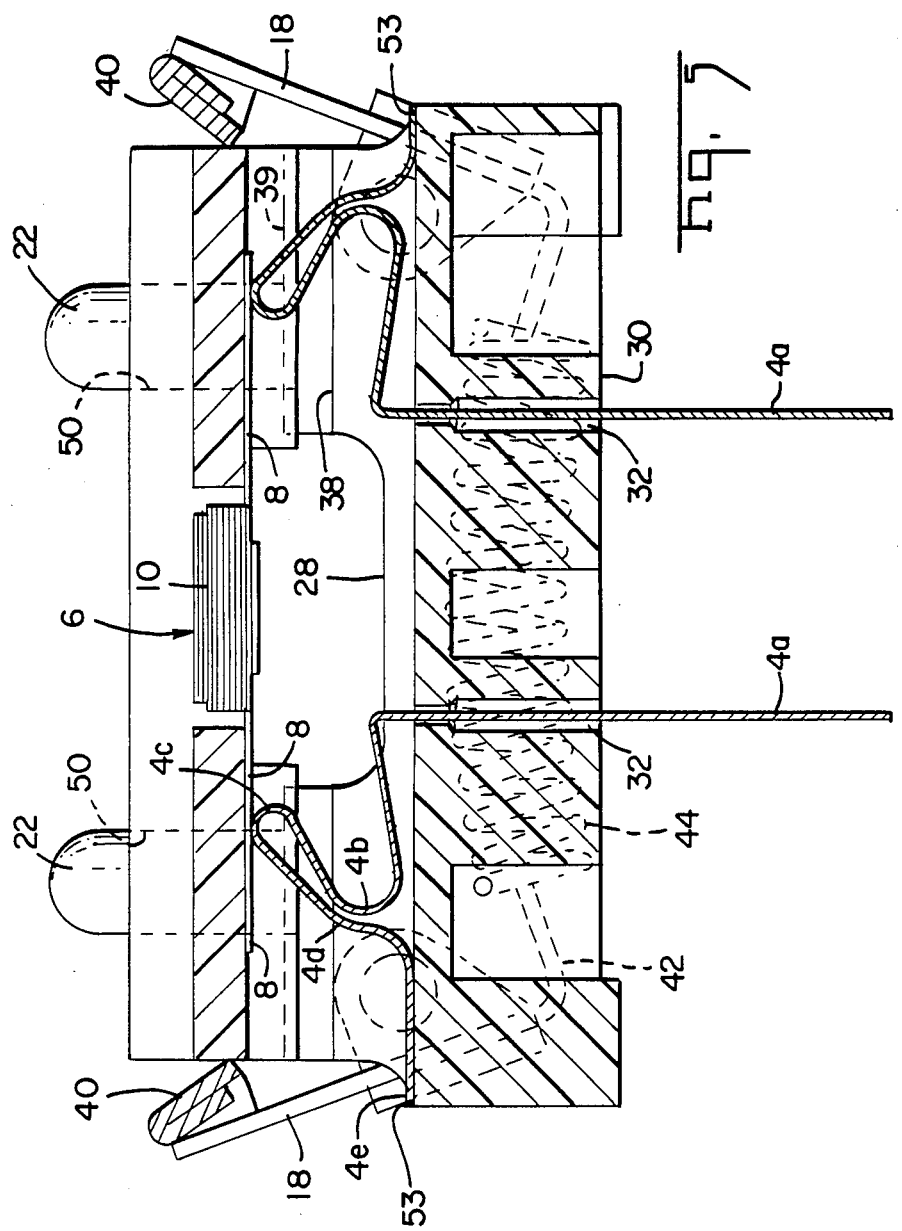

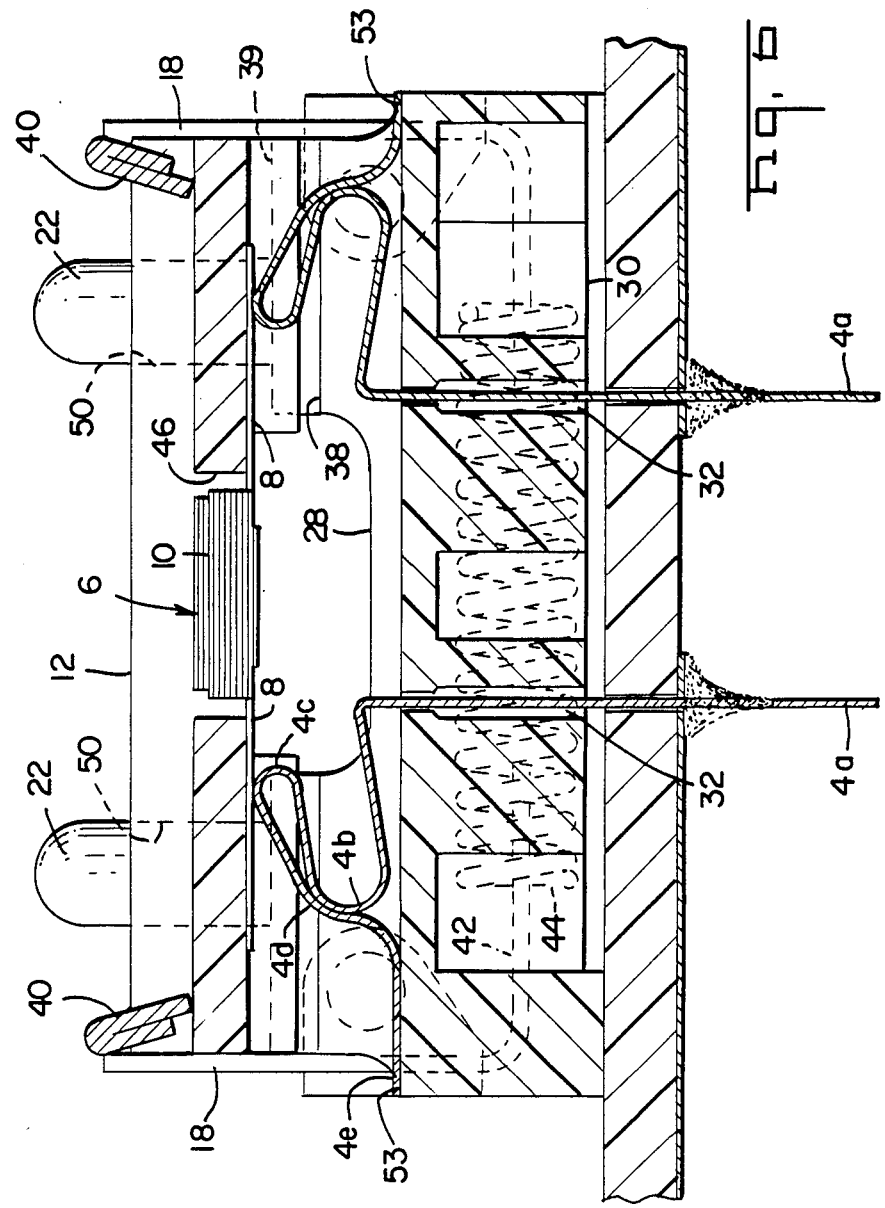

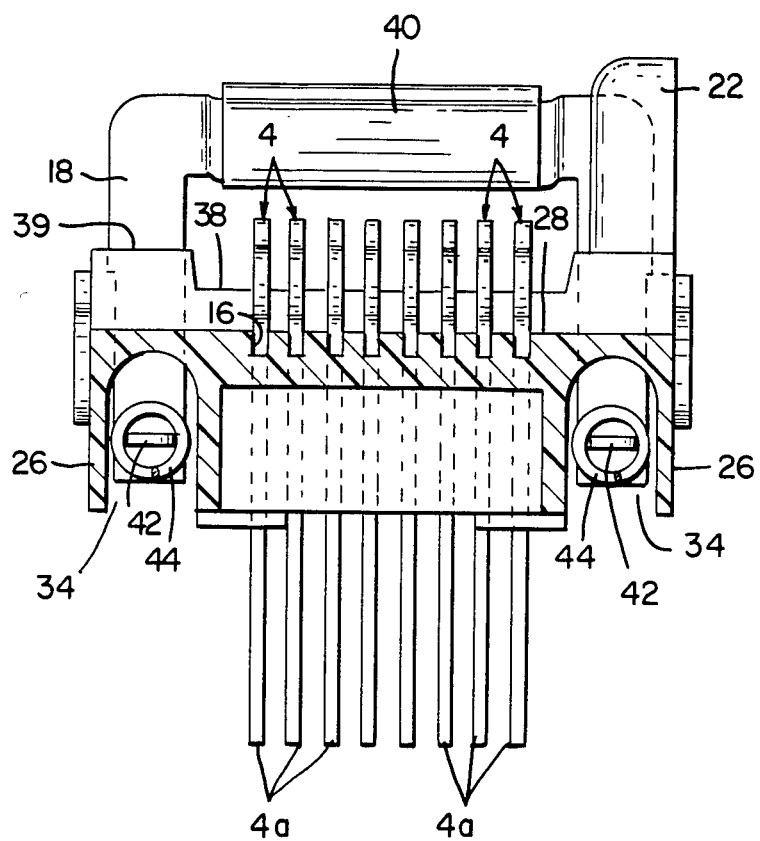

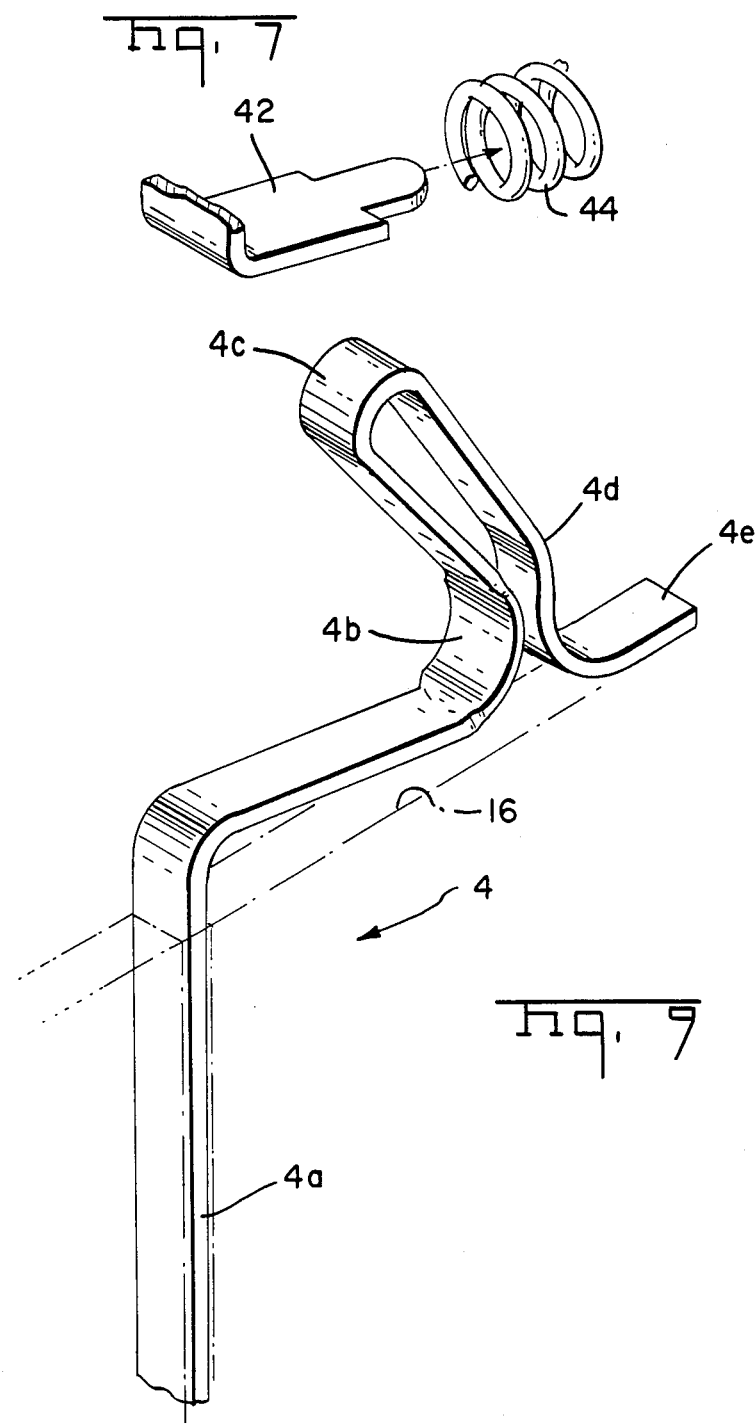

FLATPACK BURN-IN SOCKET

This application is a continuation of application Ser. No. 781,570 filed Sept. 30, 1985 now abandoned.

BACKGROUND OF THE INVENTION

This invention relates to a socket for interconnecting a semiconductor device package to a circuit and more particularly relates to a burn-in socket for testing flatpack semiconductor component packages.

DESCRIPTION OF THE PRIOR ART

Semiconductor devices such as integrated circuits must be packaged in some form so that the semiconductor components can be attached in a circuit or electronic apparatus. One common means of packaging a semiconductor device is the so-called flatpack package. A flatpack package employs an insulative base surrounding and encapsulating the semiconductor device. Leads are formed extending from the semiconductor device outwardly of the insulative base. In a flatpack package, these leads extend in a planar array from two or more sides of the base. Generally the leads extend outwardly in two directions with each lead being parallel to the adjacent leads.

As with other semiconductor or integrated circuit packages, flatpack packages must generally undergo some sort of testing procedure to ensure that the packages are performing satisfactorily. This is especially true since the yield of semiconductor components does not approach 100 percent. In many cases, burn-in testing is conducted on a statistical basis in which representative samples are subjected to burn-in testing. In other situations, all flat pack packages would be subjected to burn-in testing before actual use. Burn-in testing is generally conducted in large convective ovens capable of maintaining a prescribed temperature for the devices under test for a prescribed period of time. These burn-in tests generally involve the simultaneous testing of a large number of similar or identical semiconductor components. Conventionally, these semiconductor components, such as flatpack packages, are positioned within a standard carrier which is in turn positioned within a burn-in socket. Conventional burn-in sockets for flatpack packages employ an insulative housing having a plurality of spring biased contacts which are normally attached to a printed circuit board by conventional through hole soldered interconnections. These conventional flatpack sockets have singly reversely formed spring loaded contact portions. Typically, these terminals are formed from beryllium copper or beryllium nickel material. The footprint of the contact leads is in a staggered configuration. In order to maintain this staggered configuration, adjacent terminals in conventional flatpack sockets have leads of differing lengths. The contact portion of the terminals normally has a gold plating, whereas the solder tails are tin plate. The insulative housings can be fabricated from a suitable high-temperature plastic material such a polysulfone. The flatpack semiconductor devices are conventionally held within the sockets by a metal cover and interengaging latch. The matal cover is generally pivotally attached to the insulating housing of the conventional sockets and arcuately swings into the closed position after the flatpack package is positioned within the socket housing.

The instant invention represents an alternative flatpack burn-in socket which is especially suitable for use with robotic techniques which will allow the flatpack packages to be inserted into and removed from the packages automatically and in large volume. Furthermore, this invention permits the respective terminals within the flatpack package to be robotically probed to determine if the sockets themselves are properly interconnected to the printed circuit board. Thus an improperly connected socket will not be interpreted as an indication that the flatpack package is defective. The flatpack socket of the preferred embodiment of this invention also employs a terminal configuration in which a significant wipe is accomplished between the terminal and the flatpack leads, thus increasing the reliability of the spring biased interconnection between the lead contact portion and the lead itself. These and other objects of this invention are obtained by a socket having the following characteristics.

SUMMARY OF THE INVENTION

This invention, as disclosed in a preferred embodiment, is in the form of a socket for establishing electrical interconnection to a flatpack semiconductor component having a plurality of leads projecting in a planar array from the flatpack base. The socket is especially adaptable to burn-in testing for flatpack semiconductor components. The socket includes an insulative housing. The flatpack semiconductor component is secured on the upper surface of the socket housing with a plurality of terminals positioned within the housing. These terminals are positioned to be in registry with flatpack leads which may be inserted into the housing on a conventional carrier. Each of the terminals includes a contact portion which is doubly reversely formed. The contact portion is deflected during insertion of the flatpack package, and deflection of the doubly reversely formed contact portion results in lateral movement of the portion of the terminal contact in engagement with the flatpack lelads to laterally wipe the flatpack leads.

BRIEF DESCRIPTION OF THE DRAWINGS

FIG. 3 is a sectional view taken along Section line 3—3 of FIG. 1, showing the relationship of the socket, the flatpack semiconductor component, and the carrier.

FIGS. 4, 5, and 6 are sectional views showing the sequential manner in which the flatpack, when mounted in the flatpack carrier, is positioned within the socket by movement of the flatpack carrier perpendicular to the upper surface of the socket.

FIG. 7 is a schematic view showing the manner in which the latch members are spring loaded.

FIG. 8 is a sectional view showing the configuration of the socket base.

FIG. 9 is a perspective view of a single terminal showing the angular orientation of the terminal relative to the bottom of a housing channel.

DETAILED DESCRIPTION OF THE PREFERRED EMBODIMENT

The flatpack socket comprising of preferred embodiment of this invention is especially adapted for robotic assembly. Robotic assembly techniques are best implemented if the assembly movements are limited to translational as opposed to rotational movements. Therefore, the flatpack socket 2 has been especially adapted to permit insertion of a flatpack 6, mounted in a flatpack carrier of conventional construction, by translational movement perpendicular to the upper surface of socket 2.

Figure 1:
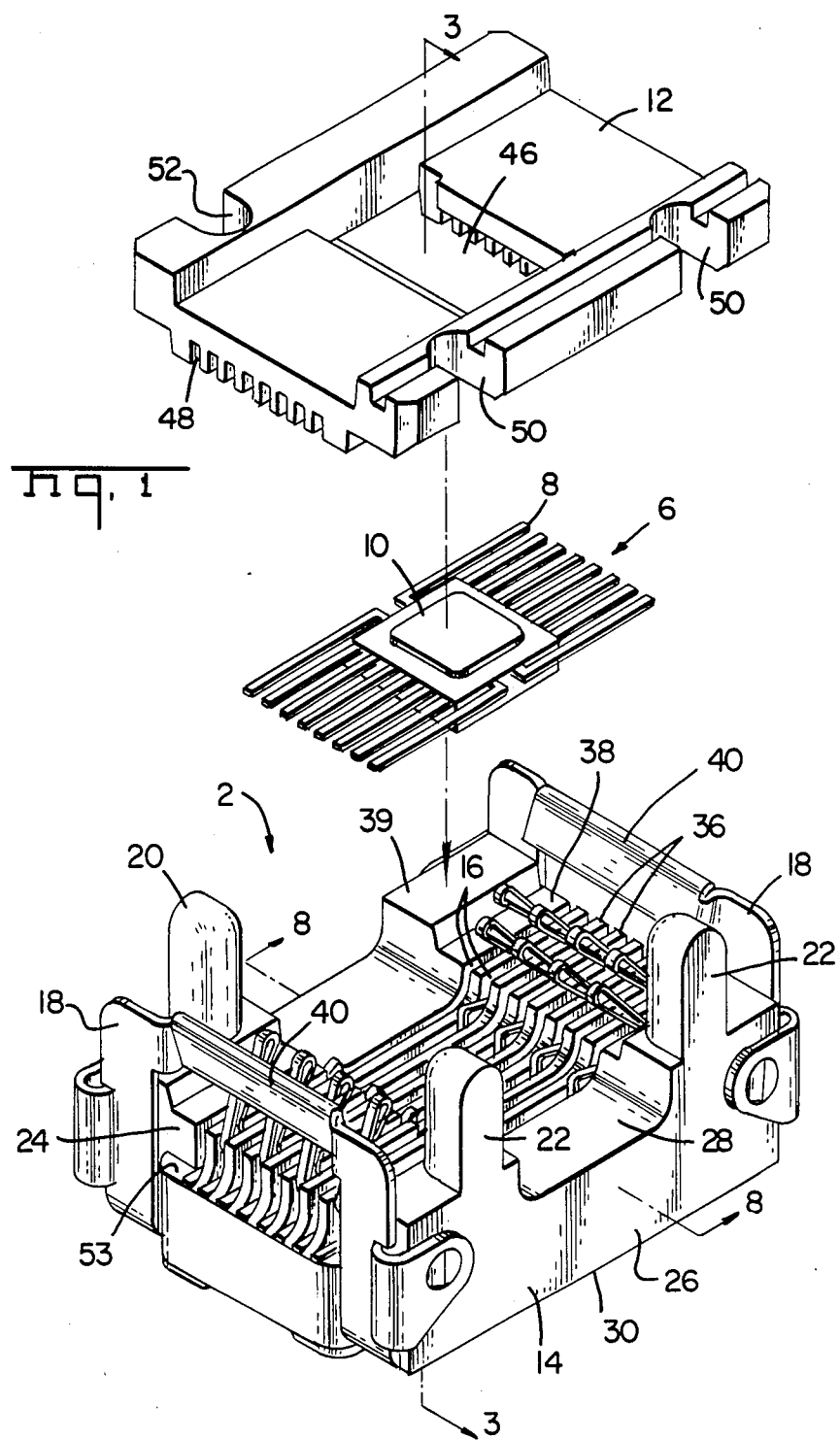
FIG. 1 is an exploded perspective view of a flatpack socket, flatpack semiconductor component, and flatpack carrier, in which an individual terminal is also exploded for clarity.
Figure 2:
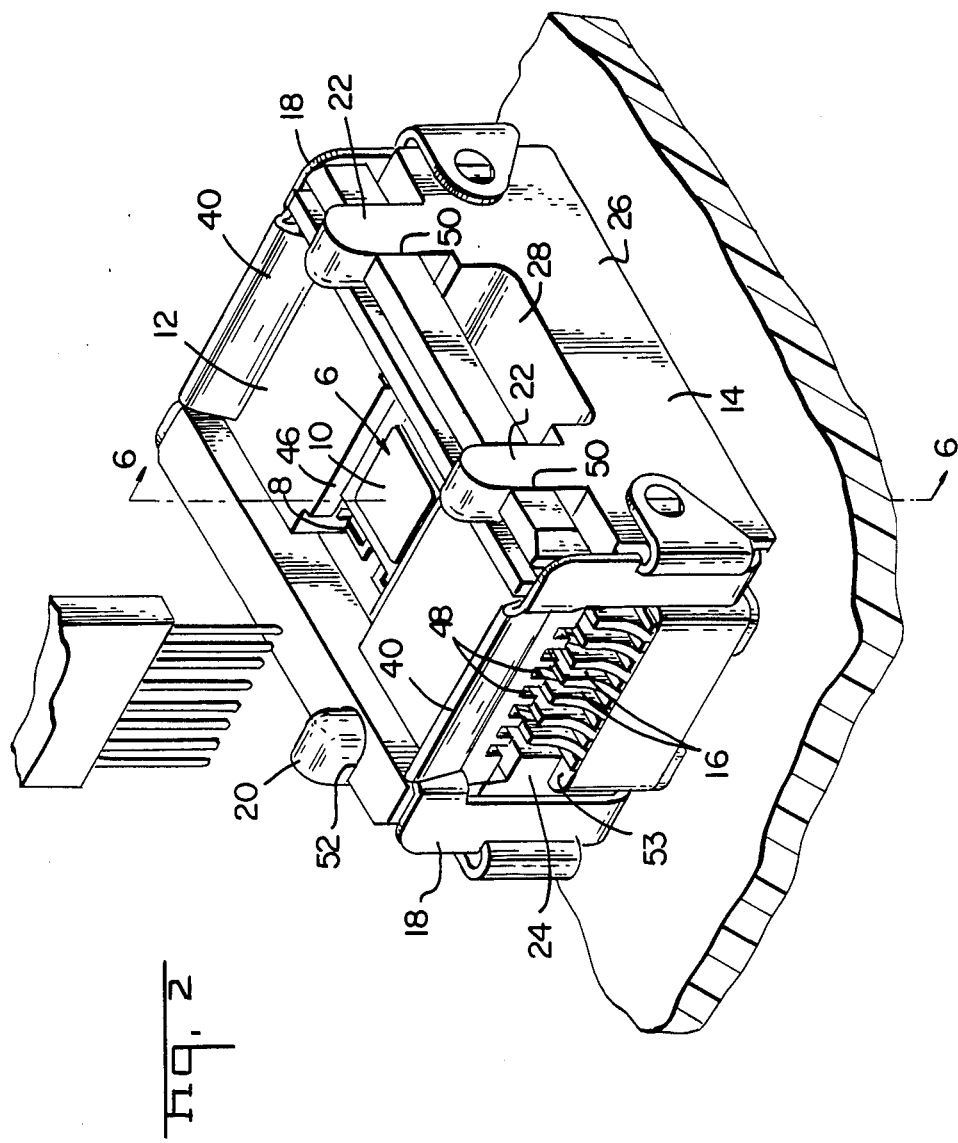
FIG. 2 is a perspective view of a flatpack socket mounted on a printed circuit board with the flatpack positioned within the carrier, showing the manner in which the socket terminals can be probed for electrical continuity.

Flatpack socket 2 comprises an insulative housing 14 containing a plurality of separate contact terminals 4 positioned within channel 16 adjacent opposite ends 24 of the insluative housing. The insulative housing 30 can be fabricated from a high temperature plastic material which can be suitable for use under the high temperature conditions encountered in a burn-in test. In the preferred embodiment of this invention, the housing 14 is fabricated of a suitable high-temperature plastic material. Housing 14 comprises a generally prismatic member having opposite ends 24 with sides 26 extending therebetween. The upper surface 28 has a plurality of barriers 36 located adjacent each end 24 of the housing. These barriers 36 form a plurality of side by side channels 16 extending perpendicular to the ends 24 of the housing and generally parallel to the sides 26. The lower surface of the channel 16 is coincident with the upper surface 53 of the probing area, and the barriers 36 extend upwardly from the upper surface. A like plurality of holes 32 extending from the upper surface 28 to the lower surface 30 are each aligned with a corresponding channel 16. The holes 36 are positioned inwardly of the housing and are positioned in a staggered configuration corresponding to that on a conventional printed circuit board used for burn-in test applications. As shown in FIG. 1, an integral post 20 extends upwardly from the upper surface 28 of the housing along one side 26. A pair of similar posts 22 extend upwardly along the opposite side of the housing. As will be described in greater detail hereafter, the positioning of these three posts serve to properly orient a flatpack carrier 12 during assembly of a flatpack semiconductor component 6 into the socket 2.

A plurality of identical contact terminals 4 can each be inserted into a channel 16. Each terminal 4 comprises a single formed member formed of a resilient material such as beryllium nickel. A first elongate portion 4a, of the terminal 4, has a length greater than the distance between the upper surface 28 and lower surface 30 of socket 2 and comprises means for insertion through hole 32 to establish an interconnection with a printed circuit board and with circuits on the printed circuit board. In the preferred embodiment of this invention, this solder leg or solder tail 4a is suitable for through hole solder interconnection to printecd circuit board traces. In the preferred embodiment invention, the terminal 4 is bent through an angle of greater than 90 degrees intermediate its end. The terminal thus forms a portion extending laterally relative to the solder tail portion 4a. This laterally extending portion is spring biased into contact with the upper surface of the insulative housing 30. The laterally extending portion thus tends to remain in contact with the housing during deflection of the terminals. A first reversely formed section 4b is formed adjacent this angle bend defining the inner end of the solder tail 4a. This reversely formed section 4b is arcuately formed through an angle greater than 90 degrees and in the opposite direction from the bend formed between leg 4a. A second reversely formed section 4c is then formed adjacent the section 4b. In the preferred embodiment depicted herein, reversely formed section 4c is again arcuately formed, but is arcuately formed through an angle greater than the arcuate deformation of the first reversely formed section 4b. Reversely formed sections 4b and 4c are mutually reversely formed such that the terminal 4 extends along a serpentine path laterally away from the solder tail portion 4a. A leg portion 4d, contiguous with the second reversely formed section 4c, is positioned closely adjacent the outer portion of the terminal along the arcuate section forming the first reversely formed section 4b. The opposite end 4e of the terminal 4 is contiguous with the leg portion 4d and extends generally colinearly with the portion of the terminal between the first reversely formed portion 4b and the bend forming the end of the solder leg 4a. Terminals 4 are positioned within channels 16 with the solder leg or solder tail portion 4a extending through holes 32. The first and second mutually reversely formed sections define a contact portion of the terminals. This contact portion is located generally within the channels 16, although the second reversely section 4c extends above the upper most ends of barriers 36. Generally the first reversely formed section 4b is located within the channel, whereas the second reversely formed section 4c is positioned above the channel. In the undeflected configurations shown in FIG. 3, all of the second reversely formed section 4c extends above the barriers 36. The end 4e of the terminals is located along the end 24 of the housing 14 and extends laterally beyond the barriers 36. Although the terminals are positioed in a staggered configuration to conform to staggered holes in a conventional burn-in printed circuit board, each of the terminals is of substantially the same length and shape, although the ends 4e of those terminals located closest to the end of the housing are trimmed prior to insertion in the housing.

The conventional flatpack semiconductor components, with which this socket is used, comprise an insulative base 10 having a plurality of leads 8 projecting therefrom in a planar array. The socket 2 is not only suitable for use in testing conventional flatpack semiconductor components, but is especially adapted to use conventional flatpack carriers commonly used to mount flatpack semiconductor components to conventional burn-in sockets. The flatpack carriers are of insulative construction and have an opening 46 intermediate the ends. The plurality of channels 48 extend outwardly therefrom and are oriented to receive the flatpack leads 8 when positioned in registry therewith. A plurality of keying grooves are positioned along the sides of the flatpack carrier. Two similar grooves 50 are located along one side, whereas only a single groove 52 is located along the opposite side.

Socket 2 has a pair of latch members 18 located along the ends 24 for engaging the flatpack carrier 12 in which a flatpack semiconductor device is mounted. These latches 18 secure the flatpack carrier and the flatpack to the upper surface 28 of the socket 2. Latches 18 have an obliquely extending catch 40 at their uppermost ends. An arm 42 extends generally perpendicular to the upright portion of the latch 18 and is adapted for engagement with a coiled spring 44 located along the lower surface 30 of the insulative housing. Engagement of the latch member 18 and the coil spring 44 is illustrated in FIG. 7. Coil springs 44 extend generally parallel to the sides 26 of the socket housing and are located within cavities 34 extending adjacent sides 26. Each of the latch members 18 on opposite ends 24 of the socket housing engage each of the two springs 44 extending along each side 26 of the socket housing 14. Since the spring is biased to exert an outwardly directed force on the lower arm 42 of each latch 18, the upper catch 40 is biased inwardly by the action of coil springs 44. Latch members 18 are conventionally secured to the exterior of the housing 14 along the sides 28 to permit pivotal movement of latch members 18.

The positioning of a flatpack semiconductor device 6 mounted in a conventional flatpack carrier 12 on socket 2 is illustrated in sectional views FIGS. 4 through 6. This insertion is done by simple translational movement perpendicular to the upper surface 28 of the socket housing 14. No rotational movement is necessary. The posts 20 and 22 extend upwardly from the socket upper surface 28 and upwardly from the uppermost ends of the channels 18 and barriers 36. It is these posts, 20 and 22, which the flatpack carrier 12 first engages. The two posts 22 located along one side of the housings are positioned for receipt within grooves 50 also located on one side of the flatpack carrier 12. The opposite post 20 engages a single groove 52 along the opposite side of flatpack carrier 12. Note that the height of the post 22 above the uppermost extend of the barriers 36 and channels 16 is significantly greater than the thickness of the flatpack carrier. FIG. 4 shows that the flatpack carrier has essentially been fully engaged with posts 22. As the translational movement of the flatpack carrier towards the socket 2 continues, the flatpack carrier engages the catches 40 and cams the upper part of latches 18 outwardly against the bias of spring 44. Continued downward movement of carrier 12 brings the leads 8 on the flatpack semiconductor component 10 into engagement with the outer part of the second reversely formed portion 4c of terminals 4. As shown in FIG. 5, the second reversely formed section 4c engages the leads 8 prior to complete insertion of the flatpack carrier into the socket 2. As shown in FIG. 5, the leg portion 4d is spaced from the outer part of the first reversely formed section 4b. Continued downward movement of the flatpack carrier 12 causes relative lateral movement of the second reversely formed section 4c, and results in a lateral wipe along the leads 8. Since the leads 8 are supported by the flatpack carrier, this wipe does not damage the leads, but it is sufficient to remove contaminates and result in a better electrical interconnection. When the flatpack carrier 12 is fully inserted, as shown in FIG. 6, the catches 40 on latches 18 engage the upper surface of the flatpack carrier to secure the carrier to the socket 2. Thus, insertion of the flatpack semiconductor component 6 has been accomplished by translational movement only, with the posts 20 and 22 serving to guide this translation of movement and not just to key the flatpack carrier to the socket housing 14.

Excessive deflection of the terminals 4 is prevented by the engagement of leg 4d with the outer part of the reversely formed section 4b as shown in FIG. 6. As shown in FIG. 9, reversely removed section 4b is coined and thus is thinner, having a moment of inertia differing from the remainder of the terminal. Therefore, initial deflection of the terminal will occur in reversely formed section 4b. Continued deflection will bring leg 4d into engagement with reversely formed section 4b. A stiffer spring resists further deformation and imparts a high contact force to the leads despite the relatively large deflection prior to engagement between the two terminal sections.

When the flatpack carrier is fully inserted in the configuration shown in FIG. 6, the ends 4e of the terminals extend laterally beyond the upright latch members 18. Thus, the terminal ends 4e are exposed such that the terminals can be electrically probed. By probing the socket terminals perpendicular to the housing upper surface 28, in this manner, the continuity of the terminals 4 within the housing and to the printed circuit board can be checked independently of the flatpack circuit integrity and independently of the integrity of the contact integrity between the terminal and the flatpack leads 8. Thus, defects due to the socket itself and not due to a failure of the flatpack semiconductor component can be identified. The leads can also be individually probed to permit dynamic electrical testing of the semiconductor device. Thus, the performance of individual inputs and outputs of the semiconductor device can be tested. The facility to probe from above, in this manner, is especially suitable for robotic techniques. In turn, these robotic techniques are especially suited for simultaneously handling a large number of flatpack semiconductor components.

The socket 2, comprising of preferred embodiment of this invention, is easily adaptable for use with flatpack semiconductor components of different sizes. Although intended for use with robotic assembly techniques, it should be understood that this socket could also be assembled by more conventional means. Furthermore, minor modifications could be made to this socket which would not depart from the scope of this invention and would perform in a similar manner. Therefore, the claims directed to this invention should be interpreted as covering not only the structure of the preferred embodiment of the invention, but of equivalents thereto.

What is claimed is:

1. A socket for establishing electrical interconnection to a flatpack semiconductor component having a plurality of leads projecting in a planar array from a base, the socket comprising:
an insulative housing;
means for securing the flatpack semiconductor component on an upper surface of the housing; and
a plurality of terminals positioned within the housing in registry with the flatpack leads, each terminal comprising a lead portion extending through the housing from the housing upper surface to a housing lower surface and a resilient contact portion in transition with a lower leg portion extending laterally along the spaced above the housing upper surface, the lead portion and the leg portion having a substantially L-shaped profile, each contact portion being doubly reversely formed intermediate the ends thereof, a first reversely formed section being adjacent and in a noncontacting relationship with the housing upper surface, the second reversely formed section being in transition with the first reversely formed section and spaced from the housing upper surface, the first and second reversely formed sections being mutually reversely formed, whereby each contact portion is deflectable when a flatpack semiconductor component is secured to the upper surface of the housing with the leads engaging corresponding second reversely formed sections to establish and maintain electrical contact with corresponding leads.

2. The socket of claim 1 wherein the contact portion is deflectable about the first reversely formed section, the second reversely formed section being laterally movable upon deflection about the first reversely formed section to laterally wipe corresponding leads.

3. The socket of claim 1 wherein the terminal contact portion is spring biased relative to the terminal lead portion into engagement with the housing upper surface.

4. The socket of claim 1 wherein each terminal includes an accessible free end adjacent the second reversely formed section comprising means for dynamic electrical testing of the semiconductor component by probing individual leads.

5. The socket of claim 1 wherein a leg portion of each terminal forming one part of the second reversely formed section extends from the second reversely formed section adjacent the exterior of the first reversely formed section, the leg portion comprising means for limiting deflection of the terminal upon engagement of the leg portion with the exterior of the first reversely formed section.

6. The socket of claim 5 wherein part of the first reversely formed section is thinner than the second reversely formed section.

7. An electrical connector for interconnecting a first plurality of conductors to a second plurality of conductors, the connector comprising:
a housing member; and
a plurality of terminals stamped and formed to define terminals having a doubly reversed portion of a generally U-shaped configuration having a first and second leg disposed adjacent to but in a non-contacting relationship with each other, the contacting section of the terminal generally located at the apex of the U-shaped section, said section of terminal having means thereon for connecting to said first plurality of conductors, the terminal further comprising a first radiused portion at a base of said U-shaped section contiguous with one of said legs, the end of the radiused section defining a section of terminal projecting away from the U-shaped section, the U-shaped section, upon movement of the second plurality of conductors against the contacting section, being deformable about the radiused portion from a first undeflected position to a second deflected position where the second leg of the terminal abuts a back surface of the radiused portion thereby preventing an overstress on the terminal.

8. The connector of claim 7 wherein the housing has a top surface for mounting a plurality of said terminals thereon, the housing having apertures extending into the housing from a first side and through the housing to a second side which is mountable to a printed circuit board.

9. The connector of claim 8 wherein said connecting means comprises a plurality of solder tails disposable through said apertures in said housing and connectable to a printed circuit board.

10. The connector of claim 9 wherein the solder tails are contiguous with the first radiused portion through a portion of the terminal that lies laterally adjacent to, and spaced above, the housing top surface.

11. The conductor of claim 10 wherein upon moving from the undeflected to the deflected position, the contacting section is moved toward the laterally adjacent portion, the deflection path being along a longitudinal portion of said second plurality of conductors causing a wiping action between said contacting section and said conductors.

12. The connector of claim 11 further comprising a second radiused portion substantially adjacent to the first radiused portion and projecting a foot portion away from the laterally extending portion to lie adjacent to the top surface of the housing.

13. The connector of claim 7 further comprising a second radiused portion substantially adjacent to the first radiused portion wherein, upon moving the terminal contact portion from the undeflected to the deflected position, the reversely bent portion of the terminal directly above the second said radiused portion comes into contact with the first said radiused portion preventing overstressing the terminal.

14. The connector of claim 7 wherein the first said radiused portion has a lower moment of inertia than the second said leg causing the terminal to deflect about the first said radiused portion.

15. The connector of claim 14 wherein the first said radiused portioned is coined to provide a thinner cross-section at the first said radiused portion than at the second said radiused portion.

16. An electrical connector for interconnecting a flat pack semiconductor component having a plurality of leads extending in a planar array from a base to a printed circuit board, the connector comprising:
a housing member including an upper surface and a lower surface, and side walls and endwalls, the upper surface including channels extending therealong in registry with the leads of the flat pack components, the channels extending to the end wall at each housing end;
a plurality of terminals disposed in said channels, each terminal being stamped and formed of one strip of material to generally define a printed circuit board interconnection portion, a flat pack lead contacting portion and a probe-able contact portion, the flat pack lead contacting portion being defined by a doubly reversed portion of a generally U-shaped configuration having first and second leg portions disposed adjacent to but in a noncontacting relationship with each other, the first said leg portion being in transition with the printed circuit board interconnection portion which extends between the upper and lower surfaces, the second leg portion being in transition with the probe-able contact portion, the free end of which lies within the channel and extends substantially to the endwall at each said housing end, whereby the probe-able contact free ends are exposed adjacent the endwalls of the housing to permit these exposed free ends to be probed perpendicular to the housing upper surface.

17. The connector of claim 16 further comprising a carrier member having a plurality of channels profiled for receiving the leads of the flat pack semiconductor component.

18. The connector of claim 17 wherein the housing further comprises means to latch the carrier and flat pack in electrical interconnection with the terminal contact portions.

19. The connector of claim 18 wherein the latching means comprises two latch members, each disposed at opposite ends of the connector housing, each latch member being rotatably biased about an axis transverse to the direction of the channels and parallel to the plane of the upper surface, the latch members being rotatable outwardly to an unlatched position to allow the entry of the flat pack component and carrier and rotatable inwardly to latch the flat pack component and carrier in place, and to return to the normally biased position.

20. The connector of claim 19 wherein the latch members, when in the latched position, extend inwardly of the endwalls, exposing the probe-able contact portions to perpendicular probing.

* * * * *

UNITED STATES PATENT OFFICE
CERTIFICATE OF CORRECTION

Patent No. 4,717,347         Dated January 5, 1988

Inventor(s) David A. Babow; Thomas K. Doench; Angelo V. Angeleri

It is certified that error appears in the above-identified patent and that said Letters Patent are hereby corrected as shown below:

In column 6, line 53, claim 1, change "the", first occurrence, to ---and---.

In column 7, line 67, claim 11, change "conductor" to ---connector---.

Signed and Sealed this

Twelfth Day of July, 1988

Attest:

DONALD J. QUIGG

Attesting Officer

Commissioner of Patents and Trademarks